United States Patent
Zhu

(10) Patent No.: US 9,936,592 B2
(45) Date of Patent: Apr. 3, 2018

(54) REAR HOUSING OF DISPLAY APPARATUS AND DISPLAY APPARATUS

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventor: Yusong Zhu, Beijing (CN)

(73) Assignees: BOE TECHNOLOGY GROUP CO., LTD., Beijing (CN); K-TRONICS (SUZHOU) TECHNOLOGY CO., LTD., Suzhou, Jiangsu Province (CN)

( * ) Notice: Subject to any disclaimer, the term of this patent is extended or adjusted under 35 U.S.C. 154(b) by 0 days.

(21) Appl. No.: 15/505,210

(22) PCT Filed: Aug. 14, 2015

(86) PCT No.: PCT/CN2015/087012
§ 371 (c)(1),
(2) Date: Feb. 20, 2017

(87) PCT Pub. No.: WO2016/045463
PCT Pub. Date: Mar. 31, 2016

(65) Prior Publication Data
US 2017/0280573 A1 Sep. 28, 2017

(30) Foreign Application Priority Data
Sep. 25, 2014 (CN) .......................... 2014 1 0499903

(51) Int. Cl.
H05K 5/02 (2006.01)
H05K 5/00 (2006.01)

(52) U.S. Cl.
CPC ......... H05K 5/0217 (2013.01); H05K 5/0017 (2013.01)

(58) Field of Classification Search
CPC combination set(s) only.
See application file for complete search history.

(56) References Cited

U.S. PATENT DOCUMENTS 8,418,987 B2 * 4/2013 Kakuta ................ F16M 13/005
248/917
9,591,109 B2 * 3/2017 Song .................... H04M 1/0208
(Continued)

FOREIGN PATENT DOCUMENTS

| CN | 1534336 A | 10/2004 |
|---|---|---|
| CN | 201230423 Y | 4/2009 |

(Continued)

OTHER PUBLICATIONS

International Search Report and Written Opinion dated Oct. 20, 2015; PCT/CN2015/087012.
(Continued)

*Primary Examiner* — Lisa Lea Edmonds
(74) *Attorney, Agent, or Firm* — Ladas & Parry LLP; Loren K. Thompson

(57) ABSTRACT

A rear housing of a display apparatus and the display apparatus are disclosed. The rear housing for the display apparatus includes a first case, a third case and a second case sequentially arranged in a lateral direction; a bottom of the first case includes a first retainer portion extending toward the second case, a bottom of the second case includes a second retainer portion extending toward the first case, and the first and second retainer portions are connected by means of a first connecting member; both sides of the third case are connected to the first case and the second case by means of second connecting members respectively.

16 Claims, 4 Drawing Sheets

(56) References Cited

U.S. PATENT DOCUMENTS

2006/0292723 A1* 12/2006 Fukui ..................... H04N 5/64
                                                        438/29
2008/0204987 A1    8/2008 Sakata
2017/0006716 A1*   1/2017 Hirakata ............ H01L 51/0097

FOREIGN PATENT DOCUMENTS

| | | |
|---|---|---|
| CN | 101620323 A | 1/2010 |
| CN | 101675378 A | 3/2010 |
| CN | 102748674 A | 10/2012 |
| CN | 202975526 U | 6/2013 |
| CN | 103828347 A | 5/2014 |
| CN | 203689216 U | 7/2014 |
| CN | 203734753 U | 7/2014 |
| CN | 104269109 A | 1/2015 |
| JP | 2004-317919 A | 11/2004 |
| JP | 2005-130321 A | 5/2005 |
| JP | 2009-171520 A | 7/2009 |
| JP | 2009-229998 A | 10/2009 |
| JP | 2013-243547 A | 12/2013 |

OTHER PUBLICATIONS

First Chinese Office Action dated Mar. 1, 2016; Appln. No. 201410499903.9 (Translation Not Provided).
Second Chinese Office Action dated Jul. 25, 2016; Appln. No. 201410499903.9.

* cited by examiner

REAR HOUSING OF DISPLAY APPARATUS AND DISPLAY APPARATUS

TECHNICAL FIELD

The embodiment of the present disclosure relates to a rear housing for a display apparatus and a display apparatus.

BACKGROUND

Flat display apparatuses, for example, thin film transistor liquid crystal displays (TFT-LCDs) or organic light-emitting diodes (OLED) displays, are characterized in thin thickness, low power consumption, no radiation and the like, so flat display apparatuses have been developed rapidly in recent years, and are widely used in computer display products, TV products or large-screen public display products.

A flat display apparatus generally comprises a display panel for displaying images, a front frame for protecting the front surface of the display panel and a rear housing for protecting the back surface of the display panel. For a TFT-LCD, the rear housing is also used to accommodate a backlight module. In recent years, the sizes of flat display apparatuses have been continuously increased (for example, the flat display apparatuses of 100 inch or more), therefore, the sizes of the rear housings of the flat display apparatuses are also increased as the sizes of the flat display apparatuses increase. The rear housing of a flat display apparatus is generally formed in its entirety by a metal pressing process or an injection molding process, and when the size of the rear housing is excessively large, it is necessary to increase the size of the presser, further, the resulting rear housing is liable to be distorted and/or bent, which causes damages and is disadvantageous to transportation. The above-mentioned factors result in a long mold-making period and molding difficulty for the rear housing of a flat display apparatus.

SUMMARY

At least one embodiment of the present disclosure provides a rear housing for a display apparatus, comprising a first case, a third case and a second case sequentially arranged in a lateral direction; a bottom of the first case comprises a first retainer portion extending toward the second case, a bottom of the second case comprises a second retainer portion extending toward the first case, and the first and second retainer portions are connected by means of a first connecting member; both sides of the third case are connected to the first case and the second case by means of second connecting members respectively.

In the embodiment of the present disclosure, the rear housing for the display apparatus comprises a plurality of separable cases, the cases can form a complete rear housing for the display apparatus when they are connected with each other, the separable cases can be substantially reduced in size compared with the complete rear housing for a display apparatus, thus facilitating to shorten the mold-making period and lower the molding difficulty.

In an embodiment of the present disclosure, the first connecting member comprises a first snap slot and a first snap catcher; the first snap slot is provided at one end of one of the first and second retainer portions, the first snap catcher is provided at one end of the other of the first and second retainer portions, and the first snap slot is connected with the first snap catcher.

In the embodiment, the first case 1 and the second case 2 are connected with each other through a snap slot and a snap catcher, thus it is easy to assemble the cases together.

In an embodiment of the present disclosure, the second connecting members comprise second snap slots and second snap catchers, the second snap slots are provided at an upper part of a side of the first case opposite to the second case and at an upper part of a side of the second case opposite to the first case respectively, the second snap catchers are provided at upper parts of both sides of the third case while corresponding to the second snap slots, and the second snap catchers are connected with the second snap slots respectively.

In the embodiment, the third case is connected with the first case and the second case respectively through a snap slot and a snap catcher, thus it is easy to assemble the cases together.

In an embodiment of the present disclosure, an inner surface at a side of the first case adjacent to a side of the third case is provided with at least one first positioning column, an inner surface at a side of the second case adjacent to another side of the third case is provided with at least one second positioning column, both sides of the third case are provided with bridges corresponding respectively to the first and second positioning columns, each of the bridges comprises a screw hole, and each of the bridges is fixedly connected with the first positioning columns or the second positioning column by means of threads.

In the embodiment, the third case is connected, by means of the bridges thereof, with the positioning columns of the first and second cases, so as to achieve accurate positioning and more tight connection among the above-mentioned three cases while being capable of withstanding greater deformation pressure.

In an embodiment of the present disclosure, both sides of the third case comprise lapping surfaces configured to be lapped respectively with the first and second cases, each of the lapping surfaces creating a stepped structure together with the principal plane of the third case and each of the bridges being provided at the lapping surface.

In the embodiment, the sides of the third case comprise lapping surfaces which is lapped with the sides of the first and second cases, furthermore, the third case is connected with the first and second cases through the snap catchers and the snap slots, so that the third case is not easy to fall off, and the structure among the first, second and third cases is capable of withstanding a greater deformation pressure.

In an embodiment of the present disclosure, a bottom of the third case comprises a stepped face cooperating with a structure formed by cooperation of the first and second cases.

In this embodiment, the stepped face at the bottom of the third case cooperates with the structure formed by the cooperation of the first retainer portion of the first case and the second retainer portion of the second case, which, in conjunction with the connection manner that the third case is connected with the first and second cases by means of the snap catcher and the snap slot as well as the lap joint structure at the sides of the third case, enables the third case to be not easy to fall off, and the structure among the first, second and third cases is capable of withstanding a greater deformation pressure.

The embodiment of the present disclosure may provide the following benefits. The rear housing for a display apparatus comprises a plurality of separable cases, all the case can be connected together so as to form a complete rear housing for the display apparatus, the separable cases each is notably reduced in size compared with the complete rear housing for the display apparatus, thus favorably shortening the mold-making period and suppressing the molding difficulty, and at the same time, the bottom of the first case extends toward the second case, the bottom of the second case extends toward the first case, both of the two cases are connected to from a U-shaped structure, the third case is provided within the U-shaped structure formed by the first and second cases, so that the above-mentioned three cases are much more tightened and are capable of withstanding a greater deformation pressure.

At least one embodiment of the present disclosure further provides a display apparatus comprising a front frame and a rear housing for the display apparatus of any of the above-described embodiments, and the front frame and the rear housing are assembled together so as to form a housing of the display apparatus.

The embodiment of the present disclosure may provide the following benefits. The rear housing for a display apparatus comprises a plurality of separable cases, all the case can be connected together so as to form a complete rear housing for the display apparatus, the separable cases each is notably reduced in size compared with the complete rear housing for the display apparatus, thus favorably shortening the mold-making period and suppressing the molding difficulty, and at the same time, the bottom of the first case extends toward the second case, the bottom of the second case extends toward the first case, both of the two cases are connected to from a U-shaped structure, the third case is provided within the U-shaped structure formed by the first and second cases, so that the above-mentioned three cases are much more tightened and are capable of withstanding a greater deformation pressure.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
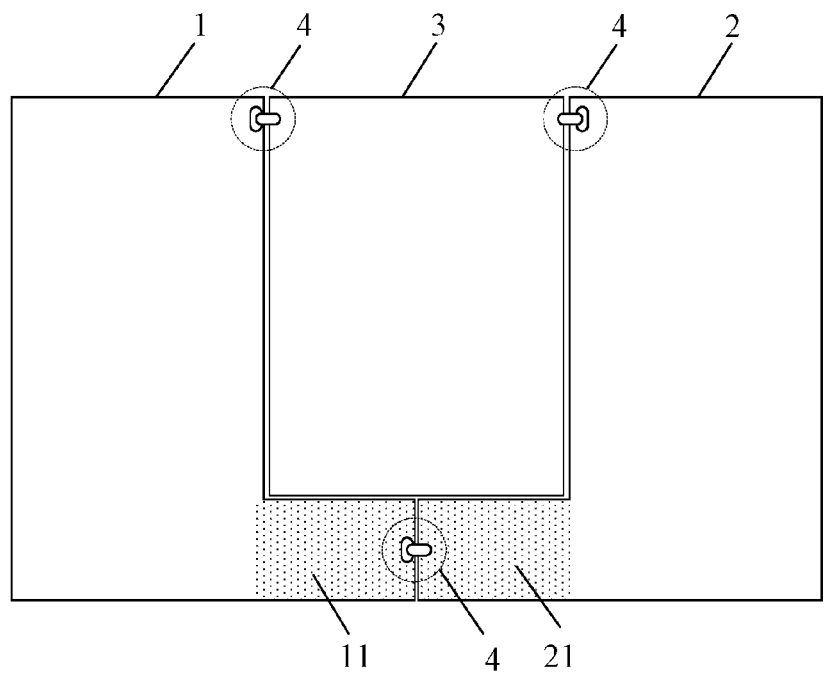
FIG. 1 is a structural representation of the rear housing for a display apparatus according to an embodiment of the present disclosure.

Referring to FIG. 1, a rear housing for a display apparatus according to at least one embodiment of the present disclosure comprises a first case 1, a third case 3 and a second case 2 sequentially arranged in a lateral direction.

The bottom of the first case 1 has a first retainer portion 11 extending toward the second case 2, the bottom of the second case 2 has a second retainer portion 21 extending toward the first case 1, and the first retainer portion 11 and the second retainer portion 21 are mutually connected by means of a connecting member 4.

Both sides of the third case 3 are connected mutually to the first case 1 and the second case 2 by means of the connecting members 4 respectively.

In one embodiment of the present disclosure, the rear housing for a display apparatus comprises a plurality of separable cases, the cases can form a complete rear housing for a display apparatus when they are connected with each other, the separable cases can be substantially reduced in size compared with a complete rear housing for a display apparatus, thus facilitating to shorten the mold-making period and lower the molding difficulty.

Figure 2:
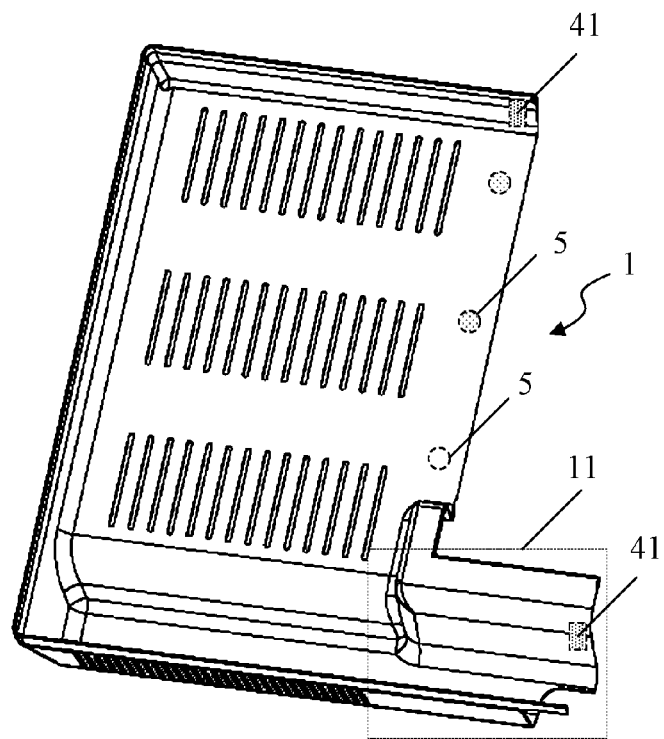
FIG. 2 is a structural representation of the first case according to an embodiment of the present disclosure.
Figure 3:
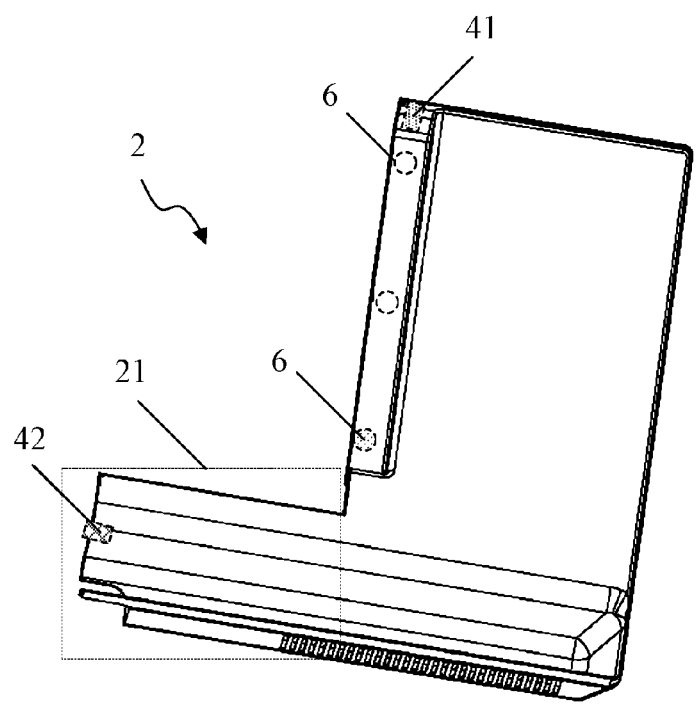
FIG. 3 is a structural representation of the second case according to an embodiment of the present disclosure.

The connecting member 4 may adopt a snap-slot/snap-catcher structure, and may also employ a blade/slit structure in which the blade is inserted into the slit so as to be fixed together. Hereafter, by way of example only, FIG. 2 is used to illustrate a structural schematic view of the first case 1, and FIG. 3 is used to illustrate a structural schematic view of the second case 2; and the connecting member 4 comprises a snap slot 41 and a snap catcher 42, and a description will be made to the first case 1 and the second case 2 with referring to the structural schematic view of the rear housing for a display apparatus as shown in FIG. 1.

The first retainer portion 11 of the first case 1 is provided with a snap slot 41 at one end thereof facing the second case 2, and the second retainer portion 21 of the second case 2 is provided with a snap catcher 42 at one end thereof facing the first case 1, and the snap slot 41 at the first retainer portion 11 is connected with the snap catcher 42 at the second retainer portion 21. In this embodiment, the first case 1 and the second case 2 are connected with each other by means of the snap slot 41 and the snap catcher 42, in the assembling process, it is only required to align the snap slot 41 at the end of the first retainer portion 11 of the first case 1 with the snap catcher 42 at the end of the second retainer portion 21 of the second case 2 and connect them, thus it is easy to assemble the cases.

Of course, it is also possible to configure in such a way that the first retainer portion 11 of the first case 1 is provided with a snap catcher 42 at one end thereof facing the second case 2, and the second retainer portion 21 of the second case 2 is provided with a snap slot 41 at one end thereof facing the first case 1, and the snap catcher 42 at the first retainer portion 11 is connected with the snap slot 41 at the second retainer portion 21.

Figure 4:
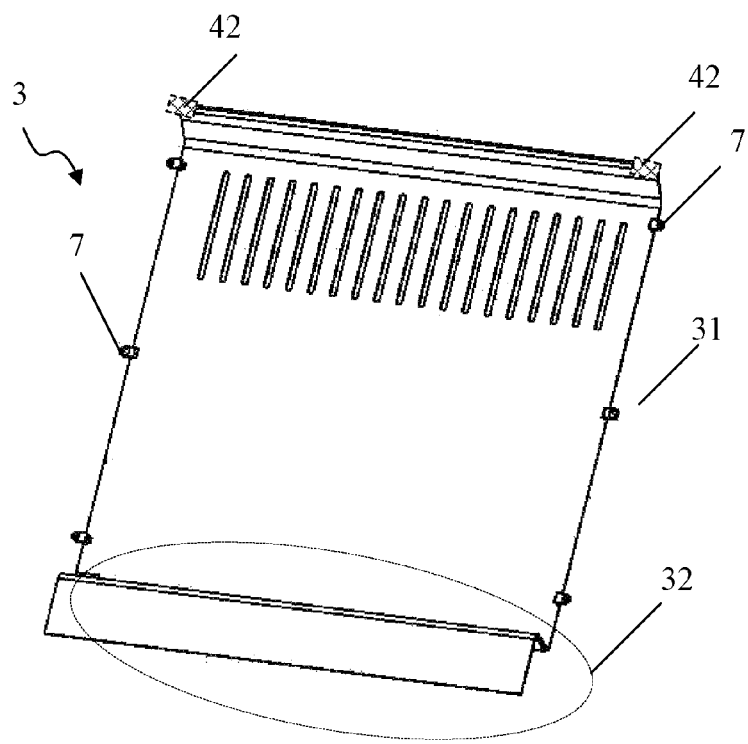
FIG. 4 is a structural representation of the third case according to an embodiment of the present disclosure.

FIG. 4 illustrates a structural schematic view of the third case 3, which is assembled together with the first case 1 illustrated in FIG. 2 and the second case 2 illustrated in FIG. 3, the structures of the three cases are described as follows.

The upper part at a side of the first case 1 opposite to the third case 3 is provided with a snap slot 41, the upper part at a side of the second case 2 opposite to the third case 3 is provided with a snap slot 41, and the upper parts at both sides of the third case 3 are provided with snap catchers 42 corresponding to the snap slots 41 respectively at the side of the first case 1 and at the side of the second case 2; the snap catchers 42 at both sides of the third case 3 are connected with the snap slots 41 at opposite sides of the first and second cases 1 and 2.

In this embodiment, the third case 3 is connected, by means of its snap catchers 42, with the snap slots 41 of the first and second cases 1 and 2, the assemble process thereof is identical to that applied between the first and second cases 1 and 2 and also facilitates the assembling, and the redundant description is omitted here.

In one embodiment according to the present disclosure, the inner surface at a side of the first case 1 adjacent to a side of the third case 3 is provided with at least one first positioning column 5, the inner surface at a side of the second case 2 adjacent to another side of the third case 3 is provided with at least one second positioning column 6, both sides of the third case 3 are provided with bridges 7 corresponding respectively to the first and second positioning columns 5 and 6, and each of the bridges 7 comprises a screw hole, each of the bridges 7 can be fixedly connected with the corresponding first positioning column 5 or the second corresponding positioning column 6 by means of threads. In this embodiment, the third case 3 is connected, by means of the bridges 7 thereof, with the positioning columns of the first and second cases 1 and 2, so as to achieve accurate positioning and more tight connection among the above-mentioned three cases while being capable of withstanding greater deformation pressure.

Figure 5:
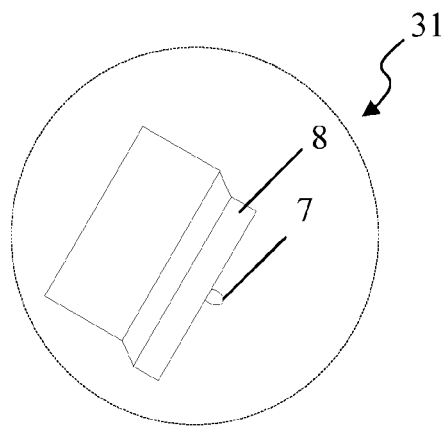
FIG. 5 is an enlarged partial schematic view of the lapping surface at a side of the third case according to an embodiment of the present disclosure.

In one embodiment according to the present disclosure, both sides of the third case 3 comprise lapping surfaces 8 which are configured to be lapped respectively with the first and second cases 1 and 2. FIG. 5 is an enlarged partial schematic view of one lapping surface at the side of the third case 3, which is the enlarged partial schematic view of the part, corresponding to the dotted line 31 as shown in FIG. 4, of the third case 3. The lapping surface 8 forms a stepped structure together with the body of the third case 3, each of the bridge 7 is provided on the lapping surface 8. In this embodiment, the sides of the third case 3 comprise lapping surfaces 8 which is lapped with the sides of the first and second cases 1 and 2, furthermore, the snap catchers of the third case 3 are connected with the snap slots 41 of the first and second cases 1 and 2, so that the third case 3 is not easy to fall off, and the structure among the first, second and third cases 1, 2 and 3 is capable of withstanding a greater deformation pressure.

In one embodiment according to the present disclosure, the bottom of the third case 3 comprises a stepped face 32 for cooperating with the structure formed by the cooperation of the first retainer portion 11 of the first case 1 and the second retainer portion 21 of the second case 2. In this embodiment, the stepped face 32 at the bottom of the third case 3 cooperates with the structure formed by the cooperation of the first retainer portion 11 of the first case 1 and the second retainer portion 21 of the second case 2, which, in conjunction with the connection manner that the third case 3 is connected with the first and second cases 1 and 2 by means of the snap catcher 42 and the snap slot 41 as well as the lap joint structure at the sides of the third case 3, enables the third case 3 to be not easy to fall off, and the structure among the first, second and third cases 1, 2 and 3 is capable of withstanding a greater deformation pressure.

Figure 6:
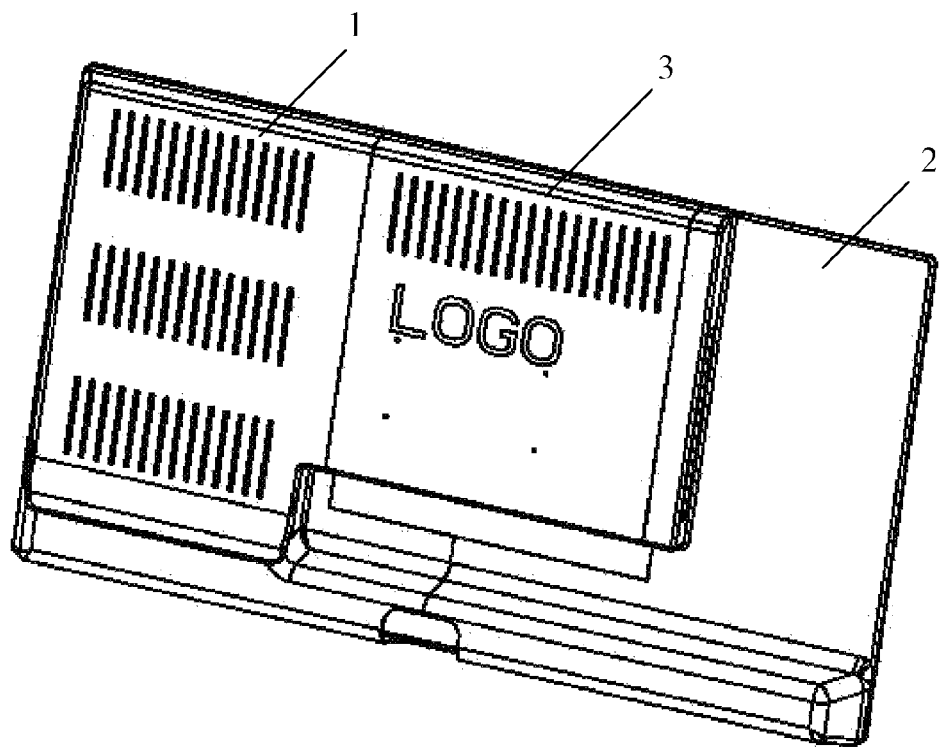
FIG. 6 is a visual effect diagram of the outer surface of the rear housing for an assembled display apparatus according to an embodiment of the present disclosure.
Figure 7:
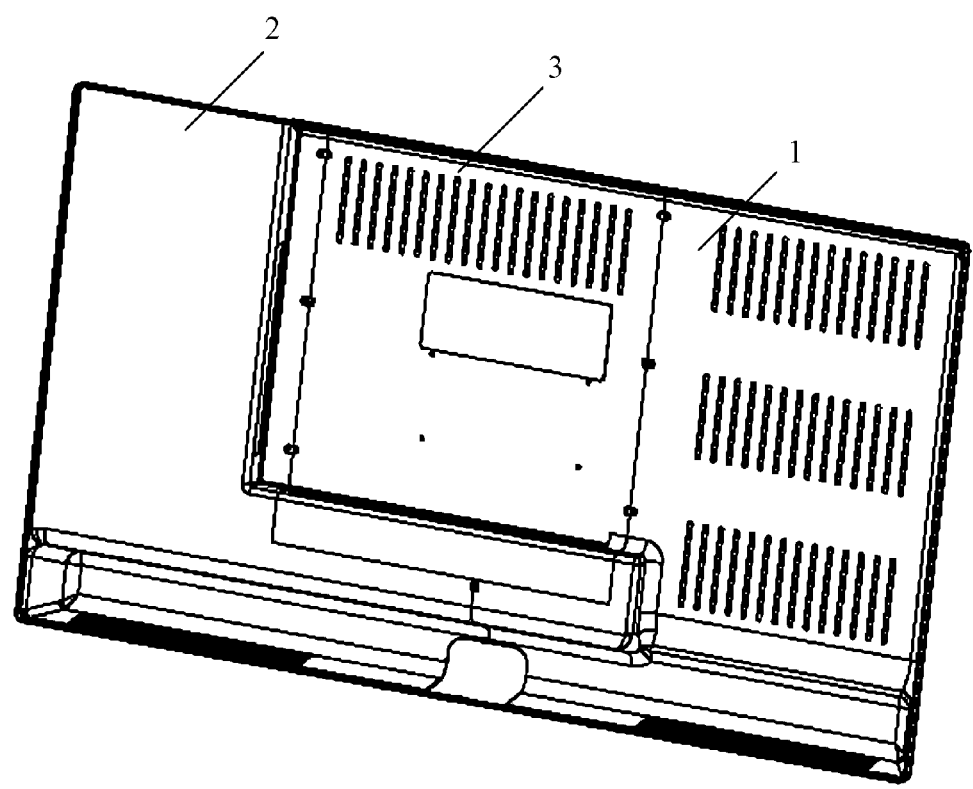
FIG. 7 is a visual effect diagram of the inner surface of the rear housing for the assembled display apparatus according to an embodiment of the present disclosure.

FIGS. 6 and 7 show the first, second and third cases 1, 2 and 3 which are assembled together in a schematic view. In the visual effect view of the outer surface of the rear housing for the assembled display apparatus as illustrated in FIG. 6, the first, second and third cases 1, 2 and 3 are sequentially arranged in the lateral direction. In the visual effect view of the inner surface of the rear housing for the assembled display apparatus as illustrated in FIG. 7, the first, second and third cases 1, 2 and 3 are sequentially arranged in the lateral direction.

Furthermore, the third case 3 can also be provided with a zone or an opening for pasting, embedding or hot-melting the logo pattern. For example, the third case 3 may be provided with an opening pattern identical to a logo pattern, the logo pattern of the same shape and dimensions are embed in or hot-melted into the opening, and the logo may be of various colors. Each case may further be provided with holes for wall hanging, which holes are configured for mounting the wall hanging retainers.

The embodiment of the present disclosure may provide the following benefits. The rear housing for a display apparatus comprises a plurality of separable cases, all the case can be connected together so as to form a complete rear housing for the display apparatus, the separable cases each is notably reduced in size compared with the complete rear housing for the display apparatus, thus favorably shortening the mold-making period and suppressing the molding difficulty, and at the same time, the bottom of the first case extends toward the second case, the bottom of the second case extends toward the first case, both of the two cases are connected to from a U-shaped structure, the third case is provided within the U-shaped structure formed by the first and second cases, so that the above-mentioned three cases are much more tightened and are capable of withstanding a greater deformation pressure.

At least one embodiment of the present disclosure also provides a display apparatus comprising a front frame, further comprising a rear housing for the display apparatus as provided by any one of the above embodiments, the front frame and the rear housing are assembled together to form the entire case of the display apparatus.

What are described above is related to the illustrative embodiments of the disclosure only and not limitative to the scope of the disclosure; the scopes of the disclosure are defined by the accompanying claims.

The application claims priority to the Chinese patent application No. 201410499903.9, filed Sep. 25, 2014, the entire disclosure of which is incorporated herein by reference as part of the present application.

What is claimed is:

1. A rear housing for a display apparatus, comprising a first case, a third case and a second case sequentially arranged in a lateral direction;
   a bottom of the first case comprises a first retainer portion extending toward the second case, a bottom of the second case comprises a second retainer portion extending toward the first case, and the first and second retainer portions are connected by means of a first connecting member;
   both sides of the third case are connected to the first case and the second case by means of second connecting members respectively.

2. The rear housing for a display apparatus according to claim 1, wherein the first connecting member comprises a first snap slot and a first snap catcher;
   the first snap slot is provided at one end of one of the first and second retainer portions, the first snap catcher is provided at one end of the other of the first and second retainer portions, and the first snap slot is connected with the first snap catcher.

3. The rear housing for a display apparatus according to claim 1, wherein the second connecting members comprise second snap slots and second snap catchers, the second snap slots are provided at an upper part of a side of the first case opposite to the second case and at an upper part of a side of the second case opposite to the first case respectively, the second snap catchers are provided at upper parts of both sides of the third case while corresponding to the second snap slots, and the second snap catchers are connected with the second snap slots respectively.

4. The rear housing for a display apparatus according to claim 1, wherein an inner surface at a side of the first case adjacent to a side of the third case is provided with at least one first positioning column, an inner surface at a side of the second case adjacent to another side of the third case is provided with at least one second positioning column, both sides of the third case are provided with bridges corresponding respectively to the first and second positioning columns, each of the bridges comprises a screw hole, and each of the bridges is fixedly connected with the first positioning columns or the second positioning column by means of threads.

5. The rear housing for a display apparatus according to claim 4, wherein both sides of the third case comprise lapping surfaces configured to be lapped respectively with the first and second cases, each of the lapping surfaces creating a stepped structure together with the principal plane of the third case and each of the bridges being provided at the lapping surface.

6. The rear housing for a display apparatus according to claim 1, wherein
a bottom of the third case comprises a stepped face cooperating with a structure formed by cooperation of the first and second cases.

7. A display apparatus comprising a front frame and a rear housing for the display apparatus according to claim 1, wherein the front frame and the rear housing are assembled together so as to form a housing of the display apparatus.

8. The rear housing for a display apparatus according to claim 2, wherein the second connecting members comprise second snap slots and second snap catchers, the second snap slots are provided at an upper part of a side of the first case opposite to the second case and at an upper part of a side of the second case opposite to the first case respectively, the second snap catchers are provided at upper parts of both sides of the third case while corresponding to the second snap slots, and the second snap catchers are connected with the second snap slots respectively.

9. The rear housing for a display apparatus according to claim 2, wherein an inner surface at a side of the first case adjacent to a side of the third case is provided with at least one first positioning column, an inner surface at a side of the second case adjacent to another side of the third case is provided with at least one second positioning column, both sides of the third case are provided with bridges corresponding respectively to the first and second positioning columns, each of the bridges comprises a screw hole, and each of the bridges is fixedly connected with the first positioning columns or the second positioning column by means of threads.

10. The rear housing for a display apparatus according to claim 9, wherein both sides of the third case comprise lapping surfaces configured to be lapped respectively with the first and second cases, each of the lapping surfaces creating a stepped structure together with the principal plane of the third case and each of the bridges being provided at the lapping surface.

11. The rear housing for a display apparatus according to claim 2, wherein
a bottom of the third case comprises a stepped face cooperating with a structure formed by cooperation of the first and second cases.

12. The rear housing for a display apparatus according to claim 3, wherein an inner surface at a side of the first case adjacent to a side of the third case is provided with at least one first positioning column, an inner surface at a side of the second case adjacent to another side of the third case is provided with at least one second positioning column, both sides of the third case are provided with bridges corresponding respectively to the first and second positioning columns, each of the bridges comprises a screw hole, and each of the bridges is fixedly connected with the first positioning columns or the second positioning column by means of threads.

13. The rear housing for a display apparatus according to claim 12, wherein both sides of the third case comprise lapping surfaces configured to be lapped respectively with the first and second cases, each of the lapping surfaces creating a stepped structure together with the principal plane of the third case and each of the bridges being provided at the lapping surface.

14. The rear housing for a display apparatus according to claim 3, wherein
a bottom of the third case comprises a stepped face cooperating with a structure formed by cooperation of the first and second cases.

15. The rear housing for a display apparatus according to claim 4, wherein
a bottom of the third case comprises a stepped face cooperating with a structure formed by cooperation of the first and second cases.

16. The rear housing for a display apparatus according to claim 5, wherein
a bottom of the third case comprises a stepped face cooperating with a structure formed by cooperation of the first and second cases.

* * * * *